(12) United States Patent
Menzel (10) Patent No.: US 6,300,622 B1
(45) Date of Patent: Oct. 9, 2001

(54) METHOD AND DEVICE FOR CHARGED PARTICLE RAY INFORMATION STORAGE

(75) Inventor: Uwe Menzel, Zeuthen (DE)

(73) Assignee: GTP, Inc., Falls Church, VA (US)

( * ) Notice: Subject to any disclaimer, the term of this patent is extended or adjusted under 35 U.S.C. 154(b) by 0 days.

(21) Appl. No.: 09/337,148

(22) Filed: Jun. 21, 1999

Related U.S. Application Data (60) Provisional application No. 60/117,337, filed on Jan. 27, 1999.

(51) Int. Cl.[7] .................................................. H01J 3/14

(52) U.S. Cl. .................... 250/234; 250/201.5; 250/222.2

(58) Field of Search ................................ 250/234, 559.4, 250/222.2, 201.5, 208.1, 568, 570; 369/44.26, 44.38, 44.39

(56) References Cited

U.S. PATENT DOCUMENTS

| | | | |
|---|---|---|---|
| 3,936,690 | 2/1976 | Salgo | 313/392 |
| 4,213,192 | 7/1980 | Christensen, Sr. | 365/118 |
| 4,566,937 | 1/1986 | Pitts | 156/628 |
| 4,668,609 | 5/1987 | Seiwatz | 430/296 |
| 4,744,636 | 5/1988 | Haven et al. | |
| 4,760,567 | 7/1988 | Crewe | 369/101 |
| 4,764,818 | 8/1988 | Crew | 358/347 |
| 4,961,178 | 10/1990 | Matsuda et al. | 369/103 |
| 4,982,362 | 1/1991 | Comberg et al. | 365/118 |
| 5,270,995 | 12/1993 | Wada et al. | 369/101 |
| 5,732,053 | * 3/1998 | Yano et al. | 369/54 |

OTHER PUBLICATIONS

Chang, T.H.P. et al., "Arrayed miniature electron beam columns for high throughput sub–100 nm lithography," *J. Vac. Sci. Technol. B*, 1992, 10(6), 2743–2748, Jun. 1992.

Hoffman, A. et al., "Surface and subsurface 1 KeV electron stimulated reduction of sapphire studied by electron spectroscopy," *Appl. Surface Sci.*, 1996, 93, 301–308 (Month unknown).

(List continued on next page.)

*Primary Examiner*—Que T. Le
(74) *Attorney, Agent, or Firm*—Woodcock Washburn Kurtz Mackiewicz & Norris LLP (57) ABSTRACT

A method and device for storage and retrieval of digitized information. The digitized information storage device consists of a storage medium, a particle ray source, and control and detection electronics. The particle ray source may consist of an electron, ion, or positron beam, a combination of these sources, or an array of one or more of those. The storage medium may consist of a single layer, possibly a compound material, which is susceptible to a structural phase transition, such as a change in morphology, topography, composition, defect concentration or adsorbing bonding characteristics under the influence of the scanning particle ray at recording parameters. The storage medium may also be comprised of two or more different layers, which are chosen from materials which are not intermixing or alloying and which have distinctly different electron or ion adsorption parameters, secondary electron emission characteristics, as well as thermal and structural properties. The information is stored by altering the composition, structure, or adsorbing density at localized sites of the single or multiple layer storage medium or by the removal of one or more layers at determined sites of the single or multiple layer medium. This is a result of exposure of these sites to the spatially confined particle ray at specific recording parameters. Digital data stored in this fashion may be retrieved by selecting specific retrieval parameters of the particle ray, such as particle energy and particle ray density, and by detecting the variations of the adsorption current at the storage medium, as the beam is scanned over the storage sites. The variations of the adsorption current are the result of different material characteristics of the storage sites, such as local work function, particle adsorption coefficient, particle reflection coefficient, secondary electron characteristic, local conductivity, and others.

41 Claims, 7 Drawing Sheets

OTHER PUBLICATIONS

Humphreys, C.J. et al., "100 KeV electron beam damage of metals, ceramics and semiconductors–implications for microanalysis and nanolithography," *Inst. Phys. Conf. Ser.*, Paper presented at EMAG 91, Bristol, Sep. 10–13, 1991, No. 119, Section 8, 319–324.

Kirkpatrick, C.G. et al., "Information–storage device using surface diodes," *Appl. Physics Lett.*, 1977, 30(11), 592–594, Mar. 1977.

Lyding, J.W. et al., "Nanometer scale patterning and oxidation of silicon surfaces with an ultrahigh vacuum scanning tunneling microscope," *J. Vac. Sci. Technol. B*, 1994, 12(6), 3735–3740, Jun. 1994.

Neidhart, T. et al., "Determination of electron–induced total sputter yield of LiF," *Nucl. Instrum. and Methods in Phys. Res. B*, 1995, 101, 127–130 (Month Unknown).

Orloff, J., "High–resolution focused ion beams," *Rev. Sci. Intrum.*, 1993, 5, 1105–1130 (Month Unknown).

Tremsin, A.S. et al., "The Mircrosphere Plate: a new type of a electron multiplier," *Nucl. Instrum. and Methods in Phys. Res. A*, 1996, 368, 719–730 (Month Unknown).

Valyaev, A.N., "Mechanisms of brittle fracture of solids exposed to intense–pulsed–electron–beams," *Nucl. Instrum, and Methods in Phys. Res. B*, 1998, 141, 555–561 (Month Unknown).

\* cited by examiner

METHOD AND DEVICE FOR CHARGED PARTICLE RAY INFORMATION STORAGE

CROSS-REFERENCE TO RELATED APPLICATIONS

The present application claims the benefit of U.S. Provisional Patent Application No. 60/117,337, filed Jan. 27, 1999, entitled "METHOD AND DEVICE FOR CHARGED PARTICLE RAY INFORMATION STORAGE."

FIELD OF THE INVENTION

The present invention relates to a data storage device. In particular, the present invention relates to a system for reading and writing data to and form a storage medium with a particle beam and determining information stored thereon in accordance with a difference between the adsorption current of the medium and a reference value as the particle beam is scanned over the storage medium to output digital information to an external device.

BACKGROUND OF THE INVENTION

As a result of the increased need for information exchange in today's increasingly technological society, information storage and retrieval has become immensely important. The rapidly growing urge for increased access to information has initiated the development of ever larger and faster data storage and retrieval systems. Many different data storage and retrieval systems are utilized to date. For example, the most common systems in use today are (i) hard disk drives, (ii) floppy disk drives, (iii) tape drives, (iv) CD-ROM and DVD drives, and (v) various forms of RAM memory. Systems for permanent data storage and data retrieval utilize methods that are based on magnetic fields (i to iii) and optical laser beams (iv), respectively. They yield high storage capacities, but are limited to storage densities of approximately $10^{10}$ bits/inch$^2$ and slow data access times of more than 5 ms. In contrast, RAM memory (v) is a "hard-wired" solid state memory, which is significantly faster than the previously described data storage devices, but with the disadvantage that the stored information is volatile and non-permanent. It also has limitations in storage density and storage capacity due to manufacturing intricacies.

In view above, and the increasing demand for data storage and fast retrieval, there is a need for a non-volatile data storage device that is faster than current magnetic and optical data storage devices that also provides for a higher data density. Such a device would be desirable because of its speed and small size. The present invention provides such a device.

SUMMARY OF THE INVENTION

The present invention describes a device that is capable of storing digitized information at ultra-high densities, with ultra-fast data retrieval times that is also non-volatile. The device includes a storage medium having at least one layer, at least one charged particle ray source emitting a particle beam, a charged particle deflection and scan unit that deflects and scans the particle beam over the storage medium, a scanning charged particle ray controller that defines parameters of particle beams emitted from the charged particle ray source to read and write data to and from the storage medium, and a detection unit that detects and amplifies an adsorption current of the storage medium at storage sites to determine stored information.

The storage medium comprises one of a metal, half metal, semiconductor, organic material, and compound material, and is adapted to store information in a non-volatile manner. The scanning charged particle ray controller positions the particle beam on the storage medium such that information can be read and written to the storage medium. The detection unit determines a difference between the adsorption current and a reference value as the particle beam is scanned over the storage medium to output digital information to an external device.

The device utilizes a scanning charged particle ray (SCPR) and a storage medium adapted to be scanned by the SCPR. By selecting appropriate parameters of the SCPR, the present invention may store data by altering the surface of the scanned storage medium and retrieve data by using distinct particle adsorption characteristics of the medium. The present invention allows for storage densities of up to $10^{15}$ bits/inch$^2$ and data access times of approximately $10^{-9}$ s.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, in which like reference numerals represent similar parts throughout the several views of the drawings, it being understood, however, that the invention is not limited to the specific methods and instrumentalities disclosed. In the drawings.

DETAILED DESCRIPTION OF THE INVENTION

Figure 1:
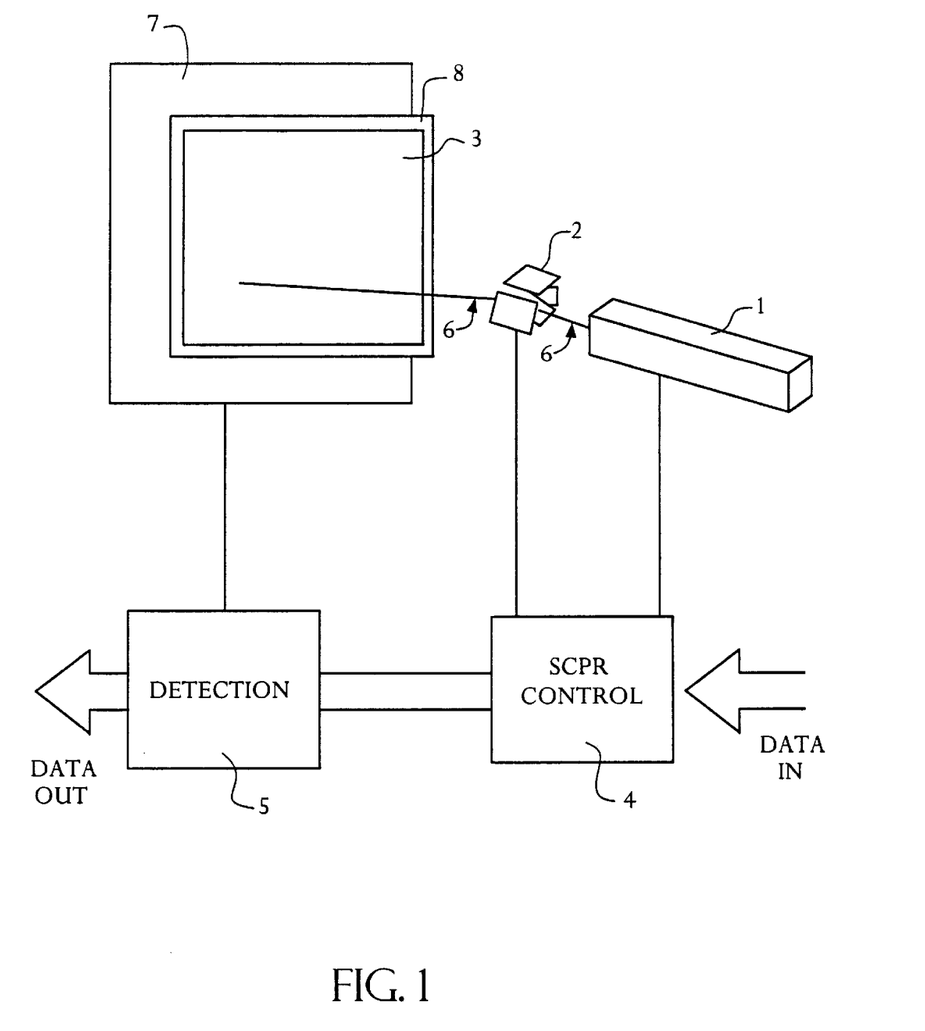
FIG. 1 is a schematic of the charged particle ray information storage device of the present invention. It diagrammatically shows the device components and method of charged particle ray information storage.

FIG. 1 shows a schematic of the data storage and retrieval system 10 of the present invention. As illustrated, the system includes a charged particle source 1, a charged particle deflection and scan unit 2, a data storage medium 3, a scanning charged particle ray controller 4, and a detection unit 5. The present invention may be characterized by a (i)

small physical size, (ii) non-mechanic and non-magnetic data storage with high storage densities and high data access speeds, (iii) insensitivity to thermal and mechanical stress, and (iv) the ability of parallel processing.

The charged particle ray source 1 may consist of an electron, ion, or positron beam, or a combination thereof. It may also be composed of an array of one or more of the above mentioned charged particle ray sources, which will be described later. It emits a beam of spatially confined and energetically resolved charged particles that enter the deflection and scan unit. Comparable charged particle ray sources are found in CRT tubes (see, e.g., S. Shirai, SPIE 2522, 232 (1995), and H. Busch, Ann. Physik 81, 974 (1926)); electron microscopes (see, e.g., M. Knoll, and E. Ruska, Zeitschrift fuer Physik 78, 318 (1932), and M. Knoll, Z. Techn. Phys. 16, 767 (1935)); focused ion beam sources (see, e.g., Jon Orloff, Rev. Sci. Instr. 64, 1105 (1993)); and flat panel displays (see, e.g., S. Itoh, et. al., "A Challenge to Field Emission Displays", Asia Display'95, p. 617, (1995)). In addition, arrays of charged particle ray sources may also be used for electron beam lithography (see, e.g., T.H.P. Chang, D.P. Kern, and L.P. Murray, J. Vac. Sci. Technol. B 10, 2743 (1992)). The above-mentioned documents are expressly incorporated herein by reference in their entireties.

In the deflection and scan unit 2, electric fields, magnetic fields, or a combination thereof may deflect the charged particle ray 6, similar to the scanner of a CRT tube or scanning electron microscope, as noted above. As a result of a combination of the deflection and scan unit 2 and the possibility to mechanically move the relative positions of the charged particle ray source 1 and the data storage medium 3 with a micro-positioning system 7, the charged particle ray 6 strikes different locations of the data storage medium 3. A registry system 8, which will be described in more detail later, allows for fast and precise determination of the required data storage address.

The data storage medium 3 may consist of a single layer, or alternately, a compound material, which is susceptible to a structural phase transition, such as a change in morphology, topography, composition, defect concentration or adsorbing bonding characteristics under the influence of the particle ray at recording parameters. The storage medium 3 may also be comprised of two or more different layers, which are chosen from materials which are not intermixing or alloying and which have distinctly different electron or ion adsorption parameters, secondary electron emission characteristics, as well as thermal and structural properties. The storage medium 3 is biased to a reference potential for the purpose to either attract or repell incident and generated charged particles such as secondary electrons, backscattered electrons, Auger electrons or reflected electrons. Depending on the polarity of the reference potential, charged particles such as secondary electrons may be attracted or repelled.

The information is stored on the medium 3 by altering the composition, structure, or adsorbate density at localized sites of the single or multiple layer storage medium 3 or by the removal of one or more layers at determined sites of the single or multiple layer medium. This is achieved by exposure of these sites to the particle ray, which is scanned over parts of the storage medium at specific recording parameters. The information is stored in sequences of 0's and 1's, corresponding to different terminal layers or distinct surface conditions of the storage medium 3. Numerous systems and materials combinations are applicable as storage medium 3. The following exemplary materials demonstrate the variety of storage media 3 and data storage concepts. Al forms an alloy with Si, initiated by the heat of a focused electron beam, which locally alters the composition at the surface. The composition of Si may also be altered by local doping with a focused ion beam of B or As. Focused ion beams of He, Ne, Kr, Ar, or Xe can cause hole-like damage to the surfaces of Si, Al, MgO, $Al_2O_3$, $AlF_3$, sapphire and amorphous carbon. Hydrogen will desorb from a H-passivated Si(100)–2×1 surface, stimulated by a focused electron beam. Electron beams are known to stimulate the desorption of alkali-metal atoms from adsorbed layers. Alkali halides are also known to be susceptible to removal from surfaces by electron beams. Furthermore, electron beams create brittle fracture at the surface of a variety of solids. The storage media may also be comprised of an 'active' electron multiplying material, such as a microsphere plate, that is capped with a thin film, which is sensitive to electron, positron, or ion beam stimulated desorption at specific beam parameters. Examples of usage of these materials may be found in the following documents, each of which is incorporated herein by reference in their entireties: C. G. Kickpatrick, et. al. Appl. Phys. Lett. 30, 592 (1977); A. Hoffman, P. J. K. Paterson, Appl. Surf. Sci. 93, 301 (1996); C. J. Humphreys, et. al. Inst. Phys. Conf. Ser. 119, 319 (1991); J. W. Lyding, et. al., J. Vac. Sci. Technol. B 12, 3735 (1994); N. N. Ageev, Yu.A. Kuznetsov, N. D. Potekhina, Phys. Solid State 39, 1324 (1997); T. Neidhart, M. Sporn, M. Schmid, P. Varga, Nucl. Instr. Meth. B 101, 127 (1995); A. N. Valyaev, Nucl. Instr. Meth. B 141, 555 (1998); A. S. Tremsin, J. F. Pearson, J. E. Lees, G. W. Fraser, Nucl. Instr. Meth. A 368, 719 (1996); Y. Rosenwaks, Rev. Sci. Instr. 68, 2911 (1997); and Ron Naaman, Zeev Vager, Rev. Sci. Instr. 67, 3332 (1996). In addition, it is noted that the above list of materials is not intended to be all-inclusive and in no way should be construed as limiting the present invention beyond the scope of the appended claims.

It is noted that a good material combination is preferably chosen, based on (i) the simplicity of creating a spatially resolved altered surface, and (ii) the best possible signal contrast upon information retrieval.

The information is retrieved by selecting specific retrieval parameters of the particle ray 6, such as particle source, particle energy and particle ray density, and by detecting the variations of the adsorption current at the storage medium 3, as the beam is scanning the storage sites. The variations of the adsorption current are the result of different material characteristics of the storage sites, such as local work function, particle adsorption coefficient, particle reflection coefficient, secondary electron characteristic, local conductivity, and others.

The SCPR control unit 4 determines the beam parameters of the charged particle source 1 such that it can be operated in the write mode or in the read mode. The two modes may differ in the particle source, the particle energy, particle ray density, or a combination thereof. In the write mode the SCPR control unit 4 converts the digital data to be stored into corresponding control signals of the charged particle ray source that may alter the beam characteristics, by either blocking the particle ray, by changing the beam energy, or beam density. This results in a correlation of the charged particle beam parameters with the digital signal, while at the same time the particle ray is scanned over a section of the medium 3 in a (x-y)-like fashion, leaving behind an imprint which corresponds to the digital data to be stored. In the read mode the SCPR control unit 4 adjusts the particle beam to the appropriate beam parameters for reading and the deflection and scan unit scans the beam over the demanded section of the data storage medium 3 containing the stored data. In both the read and the write mode, the SCPR control unit 4 drives the deflection and scan unit 2 and the micropositioning system 7 for appropriate beam positioning. The SCPR control unit 4 may include an on-board memory, a precise timing clock, an interface which enables communication to external devices, and control electronics that manage logical tasks. Further, the SCPR 4 is also linked to the detection unit 5 to ensure correct synchronization, exact beam positioning, and to regulate the signal detection and data output process.

The detection unit 5 then detects and amplifies the current that is necessary to maintain the medium 3 at a well-defined reference potential. The detection unit 5 is capable of detecting and amplifying the sample current of each section and comparing it to a reference value, which will be used to determine if the stored value is a digital "1" or "0". An electron multiplier, which generates approximately $10^4$ to $10^6$ electrons for each incident electron based on a cascade effect (see, e.g., A. S. Tremsin, et. al., Nucl. Instr. and Meth. A 368, 719 (1996), which is incorporated herein by reference in its entirety), may be part of the storage medium 3 and will be the initial stage of the current amplification process. Determining the medium current at specific timing intervals and for distinct storage addresses retrieves the stored data. For this purpose the detected signal is converted into digital data that can be output at desired data rates and formats The detection unit 5 is used to (a) retrieve the stored data; (b) monitor the charged particle rays positioning through one or more of the following ray tracking and register methods: timing, cross marks, end marks, tracking lines, and addressing system; and (c) monitor the data writing process.

Figure 2:
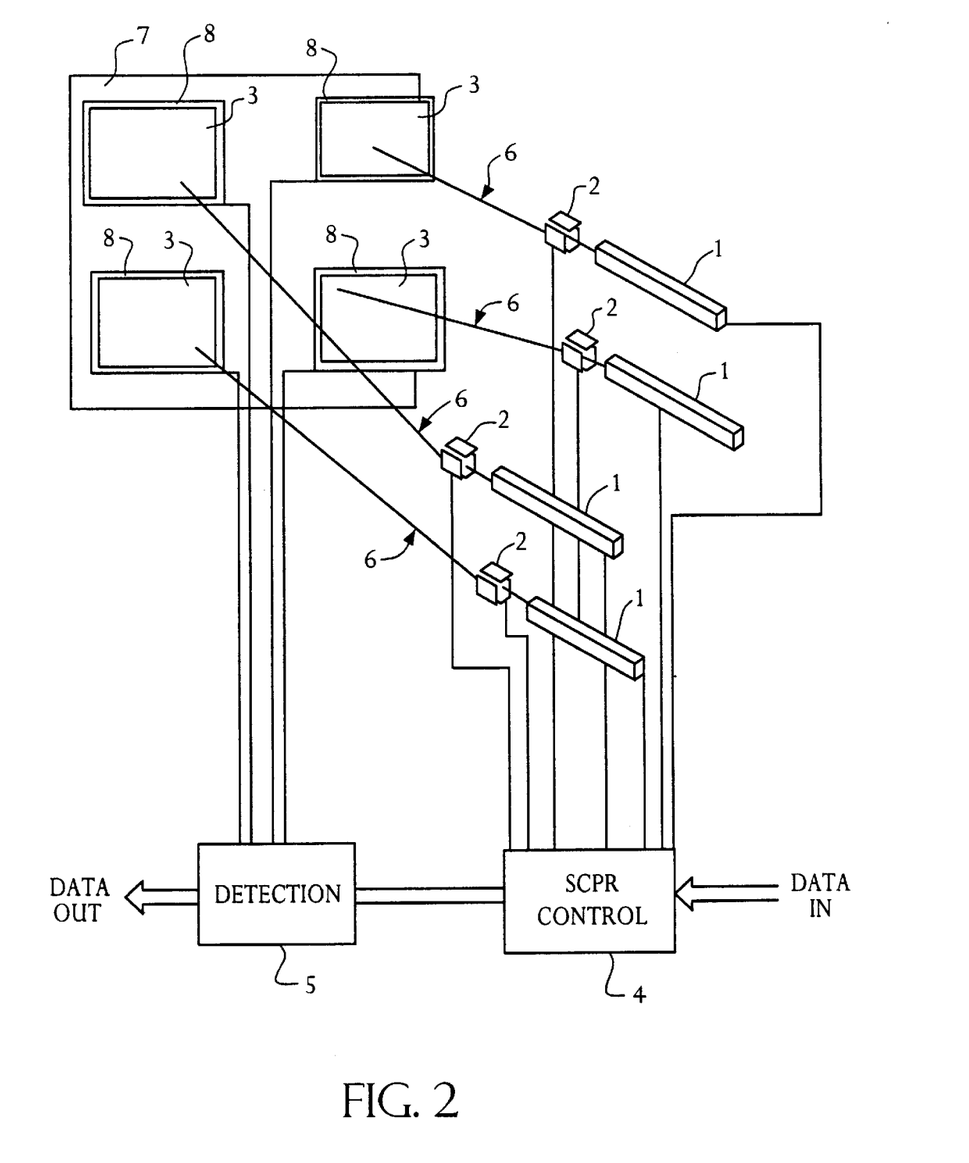
FIG. 2 schematically shows the device components of the charged particle ray information storage device, embraced with an array of four charged particle ray sources.

The charged particle ray storage device may also consist of an array of more than one charged particle ray sources 1. Such an array of charged particle ray sources 1 is shown in FIG. 2, wherein an exemplary system having four charged particle ray sources 1 is illustrated. The digital data to be stored is algorithmically split in the SCPR control unit 4 and channeled to the appropriate particle sources 1 in use. For example, a 4-bit data set may be stored by sending the signal of each bit simultaneously to one of the four different charged particle sources 1 of the array system. The particle deflection and scan unit 2 is designed in a way that allows to scan and deflect each particle ray independently, although some or all of the particle sources may be coupled to simplify the circuitry. Thus, the array of particle sources 1 will write information in parallel processing mode at designated sections of the storage medium 3. The different sections of the medium 3 correspond to different particle sources and need to be electrically isolated to allow for appropriate reading in parallel process mode. Reading of the information stored in the data storage device comprised of an array of particle sources I occurs by simultaneously measuring the current between each section of the storage medium 3 and a common reference potential. The detection unit 5 is capable of simultaneously detecting and amplifyig the sample current of each section. The signal is algorithmically assembled into a digital data string by the SCPR control unit 4. For the earlier mentioned example of an array system of four charged particle sources 1, each of the four simultaneously detected signals will correspond to one of four digital data bits. The charged particle source arrays may be dimensioned compatible to the existing data structure and are characterized by a high degree of parallel processing. As an example an array of 128 charged particle sources may process 128 bits in a single read or write step. Array systems may contain 1000 or more charged particle sources.

Figure 3A:
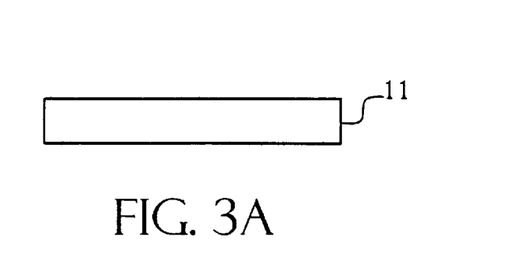
FIGS. 3a and 3b depict the writing of information onto a single layer storage medium.
Figure 3B:
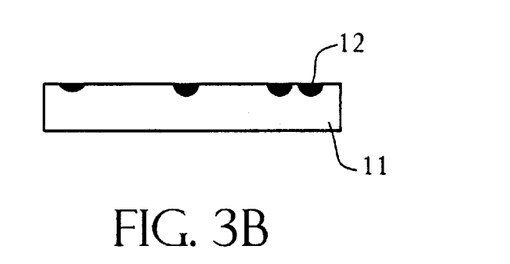

FIGS. 3a and 3b are a side view of the single layer storage medium 11, before and after the writing of data, respectively.

The storage medium 11 may be a metal, half metal, semiconductor, organic, or a compound material. The medium 11 is preferable susceptible to a phase transition, such as a change in morphology, topography, composition, defect concentration, local work function, particle adsorption coefficient, particle reflection coefficient, secondary electron characteristic, local conductivity, and others under the influence of the particle ray at recording parameters. As a result of the charged particle beam being scanned over the displayed section of the storage medium 11, a pattern of modified surface structure 12 is obtained. The particle ray induced modifications may comprise altering the composition, structure, or adsorbing density at the surface of the storage medium 11.

Figure 3C:
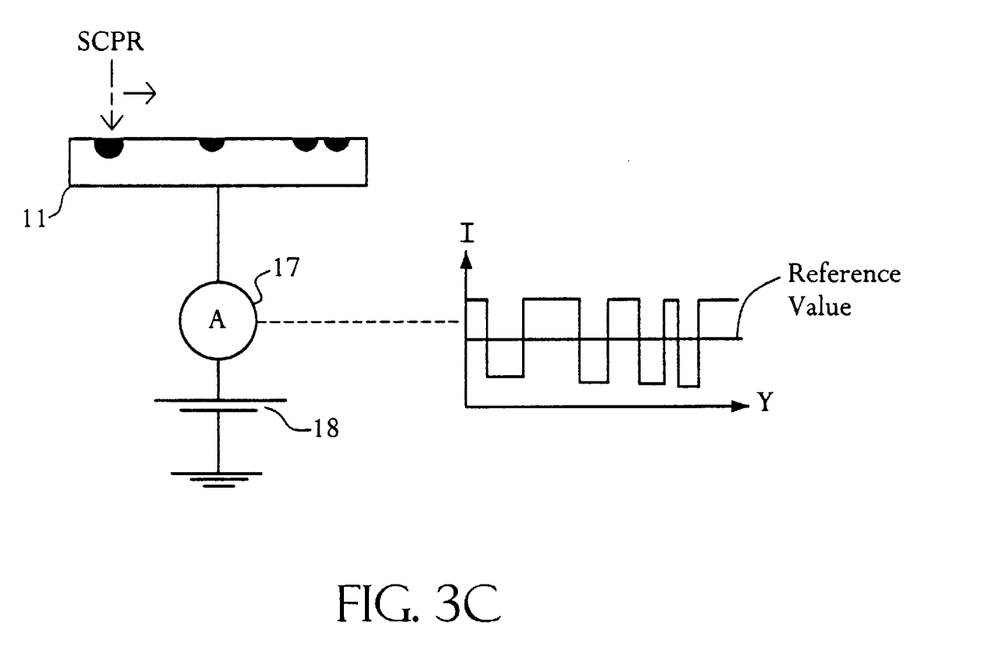
FIG. 3c illustrates the retrieval of stored information from a single layer storage medium.

Scanning this section with a charged particle ray 6 at characteristic retrieval parameters can retrieve the information stored in this way. The retrieval parameters are defined by the particle energy, the particle source, the particle ray density and phase. FIG. 3c shows that the stored pattern of different surface structure of the storage medium 11 results in variations of the adsorption current at the storage medium 11, as the beam is scanned over the storage sites. The variations of the adsorption current are the result of different material characteristics of the storage sites, such as local work function, particle adsorption coefficient, particle reflection coefficient, secondary electron characteristic, local conductivity, and others. The adsorption current 17 is detected by measuring the current between the storage medium 11 and a reference value 18.

Figure 4A:
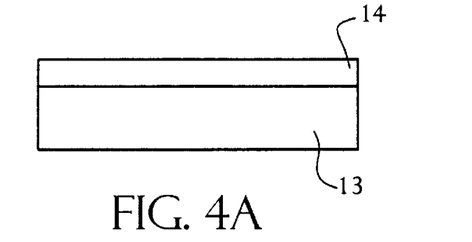
FIGS. 4a and 4b depict the writing of information onto a two-layer storage medium.
Figure 4B:
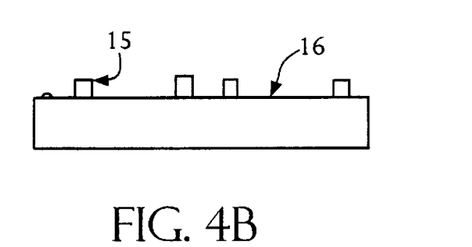

FIGS. 4a and 4b are a side view of a two layer storage medium, comprised of layers 13 and 14 before and after the writing of data, respectively. Each of the two layers 13 and 14 may consist of a metal, half metal, semiconductor, organic material, or a compound material, or combinations thereof The two layers 13 and 14 are chosen from materials which are not intermixing or alloying and which have distinctly different electron or ion adsorption parameters, secondary electron emission characteristics, as well as thermal and structural properties. Information is stored by removing the top layer 14 at designated areas by choosing the appropriate writing parameters of the charged particle beam. As a result a pattern of different terminal layers 15 and 16 of the storage medium is obtained.

Figure 4C:
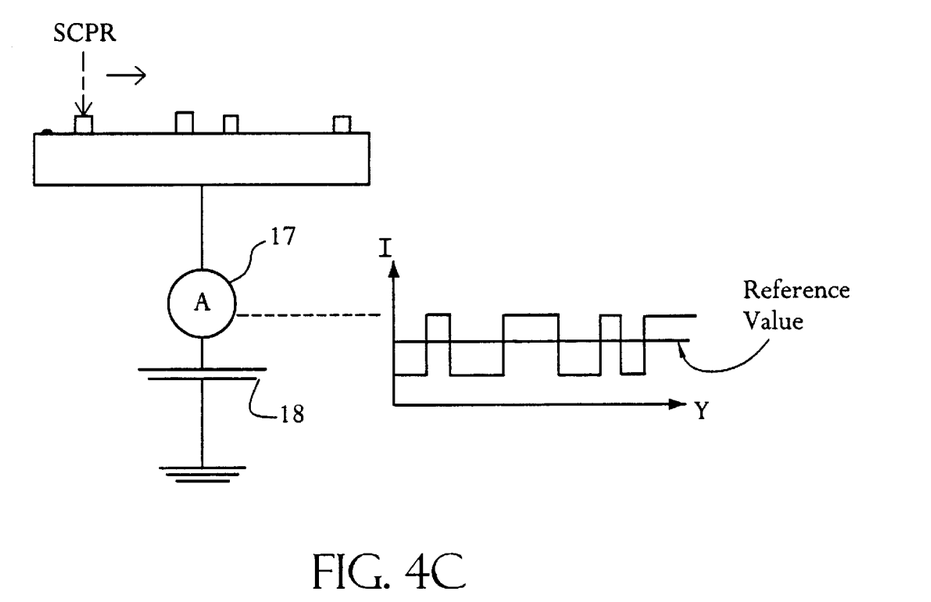
FIG. 4c illustrates the retrieval of stored information from a two-layer storage medium.

Scanning the area with a charged particle ray at characteristic read parameters retrieves the information stored in this form. The read parameters are defined by the particle energy, the particle source, the particle ray density and phase. FIG. 4c shows that the stored pattern of different terminal layers 15 and 16 of the storage medium results in variations of the adsorption current at the storage medium, as the beam is scanned over the storage sites. The variations of the adsorption current are the result of different material characteristics of the storage sites, such as local work function, particle adsorption coefficient, particle reflection coefficient, secondary electron characteristic, particle transmission coefficient, scattering characteristic, local conductivity, and others. Measuring current between the storage medium and a reference potential 18 detects the adsorption current 17.

Figure 5:
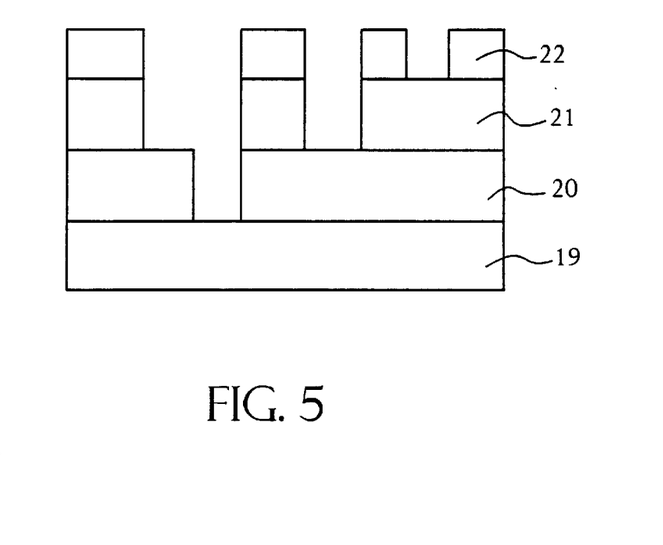
FIG. 5 depicts the writing of information onto a four-layer storage medium.

The storage medium may be comprised of more than two layers, as shown in FIG. 5, which is an example of a four layer medium. Each of the layers 19, 20, 21, and 22 may consist of a metal, half metal, semiconductor, organic material, or a compound material, or combinations thereof. The different layers are chosen from materials that are not intermixing or alloying and which have distinctly different secondary electron emission characteristics, electron or ion adsorption parameters, as well as thermal and structural properties. Information is stored by removing the top layers 22, 21 and 20 at designated areas by choosing the appropriate writing parameters of the charged particle beam. As a result a pattern of different terminal layers of the storage medium is obtained. Scanning this area with a charged particle ray at characteristic read parameters retrieves the information stored in this form. The particle energy, the particle source, and the particle ray density among others define the read parameters. The stored pattern of different terminal layers of the storage medium results in variations of the adsorption current at the storage medium, as the beam is scanned over the storage sites. The variations of the adsorption current are the result of different material characteristics of the storage sites, such as local work function, particle adsorption coefficient, particle reflection coefficient, secondary electron characteristic, local conductivity, and others. Measuring current between the storage medium and a reference potential detects the adsorption current.

Alternatively, instead of detecting the information from the adsorbed current of any of the above described two or more layered storage media, the information can be retrieved by detecting the reflected and generated charged particle current or by detecting the transmitted and generated charged particle current. The reflected and generated charged particle current is detected with a current detection unit in front of the storage medium (considering the charged particle source is in front of the storage medium). The transmitted and generated particle current is detected with a current detection unit behind the storage medium (considering the charged particle source is in front of the storage medium). For both alternative detection methods the current detection unit is comprised of a current collector and signal amplifier.

Figure 6:
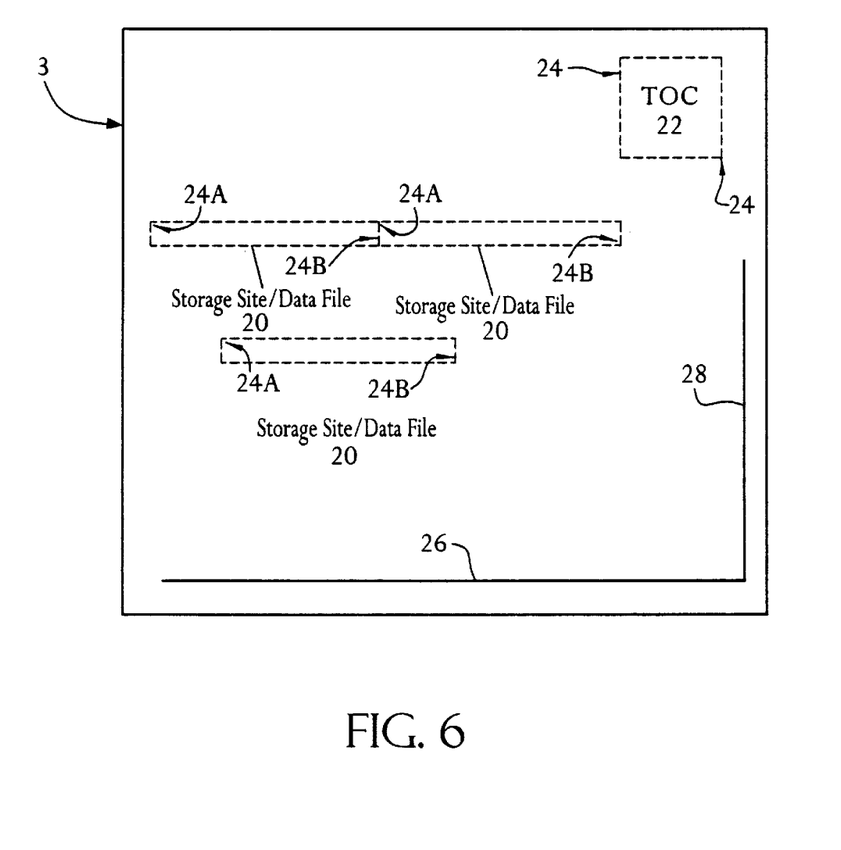
FIG. 6 illustrates the storage medium of the present invention and an exemplary organization of data thereon.

A functional description of the present invention will now be provided with reference to FIGS. 1 and 6–8. The storage device 10 may organize stored information, such that data files, which as shown in FIG. 6, are written in a line-by-line-like manner onto page-like sections 20 of the storage medium 3. A table of contents (TOC) 22, placed at an appointed location of the storage medium 3 (possibly at the top right corner of the rectangular storage medium 3 for example), provides information of the addresses of the files stored on the medium 3, as well as the format of the storage medium 3 and special instructions for the data organization.

As shown in FIG. 6, coded markers 24 are written on the storage medium 3 to indicate a start and an end of the TOC 22. The address of a specific file includes the page number and the (line, column) position on that particular page 20. Special markers 24A and 24B at the beginning and at the end of each file, respectively, will help to locate the correct set-positions of the charged particle beam 6.

The (x, y) position of the charged particle beam 6 will be adjusted by the charged particle beam deflection unit 5, which may consist of one or more sets of deflectors. As an example, a deflection unit 5 comprising two sets of electrostatic deflectors will now be described. One set of deflectors adjusts the coarse (x, y) position of the charged particle beam 6 (i.e., directs the electron beam 6 to the desired page 20 location), and the second set of deflectors scans the charged particle beam 6 rapidly line-by-line over this small section or page 20.

Digital information to be stored is input to the data storage device 10 via a signal line, which may be a data bus, a fiber optic line, or a data line, which may be interfaced with a telephone modem, with an Ethernet port, with a SCSI port, with a USB port, with a IEEE port, or with a similar data transfer or I/O devices.

The scanning charged particle control unit (SCPR control unit) 4 of the data storage device 10 translates the received digital information to be stored into signals suitable for the data storage process. This involves several steps, which are outlined in FIG. 7. First, the SCPR control unit 4 directs the electron beam 6 to the TOC 22 of the storage medium 3 to determine the position of the posterior free storage space of the storage medium 3 (S.100). Alternatively the TOC is stored in an on-board memory and the SCPR control unit 4 directly accesses storage locations 20 from there. Based on the information found in the TOC 22, the SCPR control unit 4 locates the subsequent free storage space (S. 102). An algorithm may convert the addresses and file locations into appropriate control parameters for the deflection unit 2 (S. 104). For example, in the case of a deflector unit 2 which is comprised of two sets of electrostatic (x, y) deflectors, and a data storage medium 3 which is comprised of 100×100 pages with 1000×1000 storage sites each, the coarse deflector may access the 10,000 pages by adjusting the voltages of the x- and y- deflector plates ranging from −500 V to +500 V, while each page may be scanned by the charged particle beam by setting the scan-deflector voltages, ranging from −100 V to +100 V (both x and y).

Figure 7:
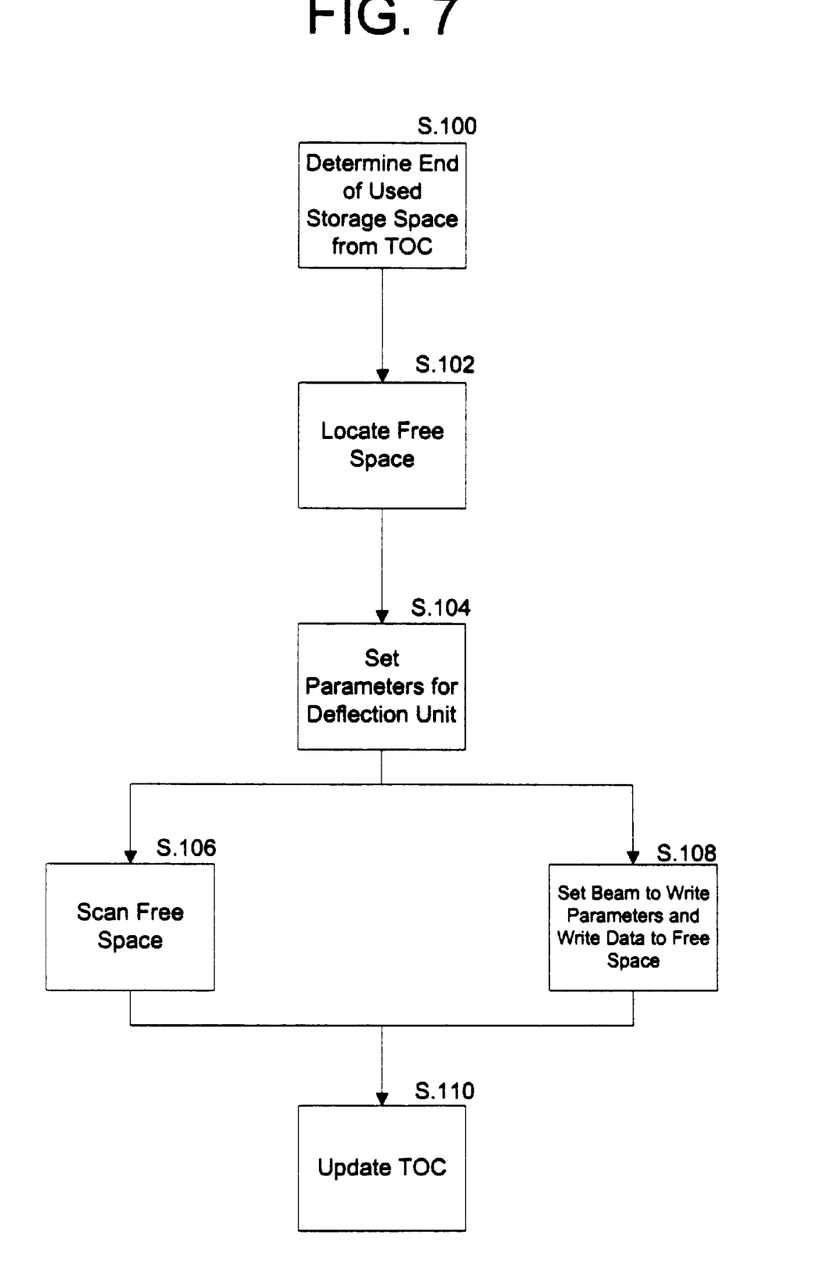
FIG. 7 is a flow chart illustrating the processes performed to translate digital information to be stored into signals suitable for use in the data storage system of the present invention.

A storage address may be structured as (page x; page y; x; y). The storage address of a file location may for example be (27, 83, 821, 134). Then the SCPR control unit 4 would adjust the voltages of the electrostatic deflectors as follows: coarse defector x: −230V, coarse deflector y: +330 V, scan deflector x: +64.20 V, scan deflector y: −73.20 V. The present example is provided to demonstrate the principles of data storage organization and addressing. It should be understood that the description has been simplified for clarity. The example does not account for non-linear deflection settings, coarse and/or scan beam positioning with magnetic deflectors and micro-positioning movers, fine position control by local search scans to locate position markers, precision beam positioning and tracking with tracking lines, cross marks, etc., as well as other details that would be evident to one of ordinary skill in the art. Further, the above example in no way should be construed as limiting the present invention beyond the scope of the appended claims.

Once the start position for the data to be stored is located on the storage medium, the SCPR control unit 4 instructs the scan unit 2 to rapidly scan the particle beam over the storage area (S.106). Concomitantly, the particle source is given the commands to alter the writing beam parameters corresponding to the digital data to be stored (S.108). This creates a pattern of different surface layers on the storage medium 3. For example, a particle beam 6 at high particle energy causes the desorption of the surface layer whereas a particle beam 6 at low particle energy does not. Alternating the particle beam energy from high energy to low energy, corresponding to digital '0' or '1', while scanning the beam over the storage medium 3, results in a pattern of altered surface structures, which may be a reflection of the digital data. After the file has been written onto the storage medium 3, the SCPR control unit 4 directs the particle source and deflector unit 2 to place an end marker at the end of the file, and outputs a signal that the storage process of the digital data has been completed. Finally, the SCPR control unit demands that the storage location and file information of the latest data stored be added to the table of contents 22 (S.110).

Figure 8:
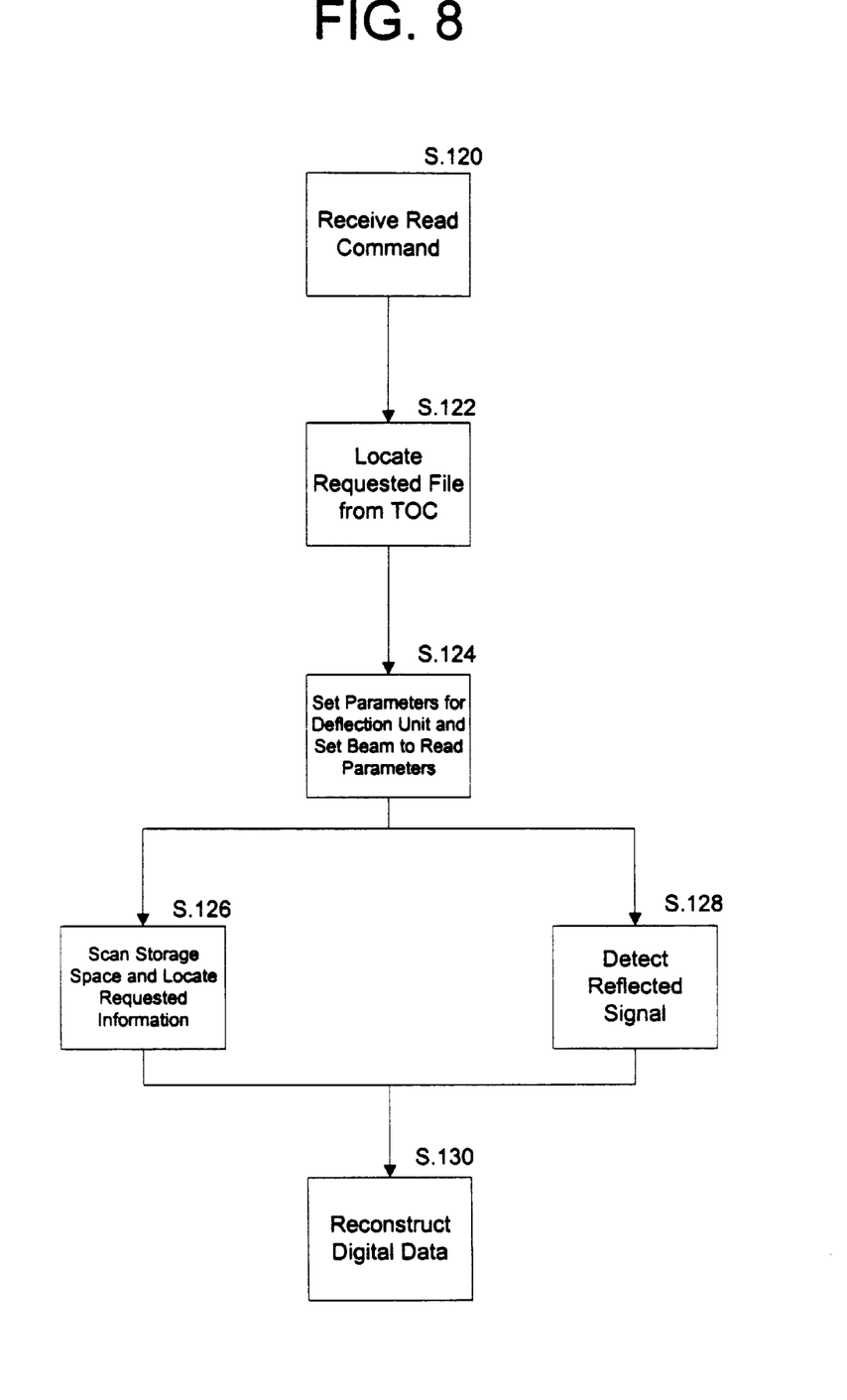
FIG. 8 is a flow chart illustrating the processes performed to read information for the storage medium of the present invention.

As shown in FIG. 8, the stored digital information may be requested by means of a "read" command incident through the I/O device of the SCPR control unit 4 by one of the earlier described devices (S.120). The storage location of the requested data file will be reconstructed from the TOC 22 (S.122). The SCPR control unit 4 instructs the deflection unit 2 to position the particle beam 6 to the storage site listed in the table of contents 22 and commands the particle source 1 to adjust the appropriate reading parameters (S.124). After the start marker 24A of the requested file is located and verified the SCPR control unit 4 directs the deflection unit 5 to scan the particle beam 6 over the storage site 20 line-by-line and subsequently page-by-page until the end marker 24B of the requested information is located (S.126). Concomitantly, the detection unit 5 is reporting the detected signal to the SCPR control unit 4. The detected signal reflects the sample current, which may be enhanced by, e.g., solid state electron multiplication and signal amplification (S. 128). Depending on the patterning of the surface area of the storage medium 3, the detected signal is comprised of a sequence of high and low signals. Based on a pre-selected threshold parameter the detection unit 5 determines whether the signal is considered as a digital one (signal is larger than the threshold value) or a digital zero one (signal is smaller than the threshold value) (S.130).

In both, the reading and writing process, precision beam positioning may further be supported by tracking lines 26 and cross marks 28 (see, FIG. 6), which will provide a feedback of the beam position through the detection of the resulting signals. The tracking lines 26 and cross marks 28 may be thin stripes on the storage medium 3 which are composed of a distinct surface or terminal layer, which when struck by the particle beam produce a distinct signal in the detection unit 5. This tracking information is continuously surveyed by the SCPR control unit 4 and fed back to the deflection unit 5, with the purpose to maintain accurate beam positioning.

It will be necessary to synchronize the writing and reading process of the data storage device 10 with the data structure, input/output format and transfer rate, etc. of external components. For this reason the incoming data (data to be stored) and/or outgoing data (data requested) may be temporarily stored in an on-board memory, which may be part of the SCPR control unit.

In an array of particle beam sources 1, the SCPR control unit 4 provides the above-described functions in parallel for each particle beam source 1 and storage section 3. In addition, various tasks are coordinated during the operation of the device 10. Such tasks include: storing the incoming data needed to be divided and directed equally to each member of the array, interpreting requests for data needed to be assembled from the divided slices of data distributed over the many storage sections 3 of the different members of the array, and providing the precise timing for the division and assembly of the data.

The stored information may be deleted, rewritten, overwritten, or reformatted by means of addressing each stored bit independently, or by regenerating and reformatting entire sections of the storage medium. The information imprinted on the storage medium may be removed in several ways. Stored information in terms of patterns of different structure, composition or adsorbing bonding characteristic on the single layer storage medium may be reformatted under the influence of the particle ray at specific reformatting parameters, heat, by surface cleavage, coherent optical radiation, or a combination thereof. Stored information in terms of patterns of different terminal layers in the two or multi-layer system may be reformatted under the influence of the particle ray at specific reformatting parameters, heat, cleavage, growth of new terminal layers, coherent optical radiation or a combination thereof.

The method and system for data storage and retrieval of the present invention manifests ultra-high storage densities and ultra-fast data access times resulting in a powerful data storage system. In current state-of-the-art technology particle rays routinely have spatial resolutions of 5 nm or better. This allows for a storage density of up to $10^{13}$ bits/inch$^2$. Spatial resolutions of less than 1nm are possible for particle beams, allowing for storage densities of up to $10^{15}$ bits/inch$^2$. Charged particle rays can be deflected and scanned very fast. Furthermore, the data retrieval method presented in this invention yields extremely fast bit sampling times, resulting in data access times of $10^{-9}$ s or better. An array of charged particle sources also permits parallel processing in the data storage and retrieval method. Considering a specific example of an array of 64 particle sources, this system is capable of storing and retrieving data at a rate of 64 bits per clock cycle. Currently, where a 64 bit data bus is state-of-the-art, the charged particle storage device of the present invention with an array of 64 particle sources will be able to store and retrieve data at data rates exceeding that of the present state-of-the-art data bus rates. Further, a particle source array designed to match the bus structure will simplify the data storage and retrieval control electronics significantly.

In view of the above detailed description, other modifications and variations will now become apparent to those skilled in the art. It is intended that the present invention of the appended claims cover all reasonable modifications and variations without departing from the spirit and scope of the invention.

What is claimed is:

1. A device for data storage and retrieval, comprising:
    a storage medium having at least one layer, said storage medium comprising material selected from the group of: metal, half metal, semiconductor, organic material, and compound material, said storage medium being adapted to store information in a non-volatile manner;
    at least one charged particle ray source emitting a particle beam;
    a charged particle deflection and scan unit that deflects and scans said particle beam of said at least one charged particle ray source over said storage medium;
    a scanning charged particle ray controller that defines parameters of particle beam emitted from said at least one charged particle ray source to read and write data to and from said storage medium, said scanning charged particle ray controller positioning said particle beam on said storage medium; and
    a detection unit that detects and amplifies an adsorption current of said storage medium at storage sites to determine stored information based on a difference between said adsorption current and a reference value as said particle beam is scanned over said storage medium, said detection unit outputting digital information in accordance with said difference.

2. The device of claim 1, wherein a phase transition is induced in said storage sites of at least one layer of said storage medium by said particle beam, said phase transition comprising one of the group of: a structural change, a change in morphology, a change in topography, a change in composition, a change in defect concentration, a local work function, a particle adsorption coefficient, a particle reflection coefficient, a secondary electron characteristic, and a local conductivity.

3. The device of claim 2, wherein said storage medium defines a pattern of different terminal surface structures with distinct particle ray adsorption characteristics as a result of said phase transition, and wherein information stored on said storage medium is retrieved by scanning said particle beam at predetermined locations and detecting a variations of said adsorption current relative to said reference value.

4. The device of claim 3, wherein said phase transition is induced in an upper layer of said storage medium.

5. The device of claim 2, wherein a variation in said adsorption current is a result of different material characteristics of said storage sites, said variations comprising a local work function, a particle adsorption coefficient, a particle reflection coefficient, a particle transmission coefficient, a secondary electron characteristic, a scattering characteristic, and a local conductivity.

6. The device of claim 2, wherein said storage medium, may be comprised of at least one active material, wherein said active material is an electron multiplying material.

7. The device of claim 1, wherein said read and write parameters of said particle beam are determined in accordance with a particle energy, a particle source, a particle ray density, and phase.

8. The device of claim 2, wherein said storage sites are organized by a registry system, wherein said scanning particle ray controller utilizes said registry system to determine a required data storage address for a piece of requested information.

9. The device of claim 1, wherein said charged particle ray comprises one of the following particles: electrons, positrons, negative ions, and positive ions.

10. The device of claim 1, further comprising a micro-mechanical positioning system, wherein a point of interaction between said particle beam and said storage medium is determined in accordance with a direction of said particle beam and a relative position of said storage medium and said charged particle ray source, and wherein said relative position of said storage medium and said charged particle ray source is controlled by said micro mechanical positioning system.

11. The device of claim 1, wherein said scanning charged particle ray control unit controls said parameters of said particle beam in order to selectively operate said particle beam in a read mode and a write mode to read and write said information to and from said storage medium, respectively.

12. The device of claim 10, wherein when said particle beam is in said writing mode, said device alters said parameters of said particle beam in accordance with said digital data received by said device by one of: blocking said particle beam, changing the particle ray energy, and changing the particle ray density, and wherein said particle beam is scanned over predetermined storage sites of said storage medium leaving behind an imprint which corresponds to said digital information to be stored.

13. The device of claim 10, wherein when said particle beam is in said reading mode, said device alters said parameters of said particle beam and scanning said particle beam over said predetermined storage sites of said storage medium, and wherein said detection unit concurrently detects and amplifies the current measured between said storage medium and said reference value.

14. The device of claim 1, wherein said scanning charged particle ray control unit comprises (i) an on-board memory, (ii) a precise timing clock, (iii) an interface which enables communication to external devices, and (iv) control electronics that manages logical tasks.

15. The device of claim 1, wherein said scanning charged particle ray control unit performs the following:
(i) conversion of incoming digital information into a sequence of instructions to said charged particle source, said deflection unit, and said micro-positioning system, such that said scanning charged particle beam creates a pattern of modified surface structure on the media, which correlates to the incident data;
(ii) instruction of said charged particle source, said deflection unit and said micro-positioning system to retrieve stored data by adopting appropriate read parameter settings, determination whether the read out signal from said detection unit is a digital 'zero' or a digital 'one', assembly of the sequence of 'zeros' and 'ones' to formatted data strings, and output of the digital information via said interface to an external device;
(iii) registry of said stored information by means of an organizational chart, such as a table of contents or a file allocation table,
(iv) management of the SCPR beam tracking, by monitoring the signal of said detection unit for distinct signals from tracking marks on said storage medium, with the consequence of immediate feedback to said particle source, deflection unit, and micro-positioning system to perform beam position adjustments.

16. The device of claim 1, wherein said detection unit determines, amplifies, and formats said adsorption current at specific timing intervals and distinct storage addresses on said storage medium, and wherein said detection unit further controls retrieval and writing of stored information, and monitoring said particle beam positioning using one of the following ray tracking and register methods: timing, cross marks, end marks, tracking lines, addressing system.

17. The device of claim 1, wherein said detection unit determines amplifies and formats the reflected and generated adsorption current in a front portion of said storage medium at specific timing intervals and distinct storage addresses, and wherein said detection unit further controls retrieval and writing of stored information, and monitoring said particle beam positioning using one of the following ray tracking and register methods: timing, cross marks, end marks, tracking lines, and an addressing system.

18. The device of claim 1, wherein said detection unit determines amplifies and formats the transmitted and generated adsorption current at a position behind said storage medium at specific timing intervals and distinct storage addresses, and wherein said detection unit further controls retrieval and writing of stored information, and monitoring said particle beam positioning using one of the following ray tracking and register methods: timing, cross marks, end marks, tracking lines, addressing system.

19. The device of claim 1, wherein said charged particle ray source comprises of an array of charged particle ray sources, wherein said digital information to be stored as said stored information on said storage medium is divided in a predetermined manner by said scanning charged particle ray controller and directed to said array of charged particle ray sources, wherein said charged particle deflection and scan unit deflects and scans each charged particle ray source of said array of charged particle ray sources independently.

20. The device of claim 17, wherein said array of charged particle ray sources writes said stored information in a parallel processing mode at designated sections of the storage medium, wherein different sections of said storage medium correspond to each charged particle ray source.

21. The device of claim 18, wherein reading of said stored information is performed in said parallel processing mode by measuring the current between each of said different sections of said storage medium and said reference value, and wherein said detection unit is adapted to simultaneously detect and amplify said adsorption current of each section.

22. The device of claim 2, wherein an imprinted pattern corresponding to said stored information being deleted, rewritten, overwritten, or reformatted with the application one of: exposing said storage medium to said particle beam at specific reformatting parameters, or exposing said storage medium to heat, surface cleavage, and growth of new terminal layers.

23. The device of claim 2, wherein an imprinted pattern corresponding to said stored information being deleted, rewritten, overwritten, or reformatted by one of: addressing each stored bit independently, or regenerating and reformatting entire sections of the storage medium.

24. The device of claim 1, wherein said at least one charged particle ray source comprises one of a spatially confined charged particle ray and an energetically resolved charged particle ray.

25. The device of claim 1, wherein said charged particle deflection and scan unit deflects said particle ray using electric fields or magnetic fields.

26. A device for data storage and retrieval, comprising:
a non-volatile storage medium having storage sites;
at least one charged particle ray source emitting a particle beam;
a charged particle deflection and scan unit that deflects and scans said particle beam of said at least one charged particle ray source over said storage medium;
a controller that determines parameters of said particle beam for reading and writing to and from said storage non-volatile storage medium; and
a detection unit that detects and amplifies a signal from said storage medium at said storage sites to determine information stored thereon.

27. The device of claim 26, wherein said signal is an adsorption current, wherein variations in said adsorption current is a result of different material characteristics of said storage sites, and wherein said different material characteristics are representative of information stored at said storage sites.

28. The device of claim 26, where said non-volatile storage medium has at least one layer, said at least one layer comprising one of the material selected from the group of: metal, half metal, semiconductor, organic material, and compound material.

29. The device of claim 26, wherein said controller determines said parameters of said particle beam to selectively operate said particle beam in a read mode and a write mode to read and write said information to and from said storage sites, respectively, and wherein said controller determines a position of said particle beam to read and write to said storage sites.

30. The device of claim 29, wherein when said particle beam is in said writing mode, said controller alters said parameters of said particle beam and scans said storage sites to leave an imprint which corresponds to digital information to be stored.

31. The device of claim 29, wherein when said particle beam is in said reading mode, said controller alters said parameters of said particle beam and scans said particle beam over said predetermined storage sites of said storage medium.

32. The device of claim 29, wherein said read and write parameters of said particle beam are determined in accordance with a particle energy, a particle source, a particle ray density, and phase.

33. The device of claim 26, wherein said controller converts digital information input into said device into a sequence of instructions to said charged particle source such that said scanning charged particle beam creates a pattern of modified surface structure at said storage sites, maintains a table of contents containing information of locations of said storage sites, retrieves stored data at said storage sites, determines whether said stored data corresponds to a digital zero or a digital one, assembles said digital ones and zero to formatted data strings, and outputs said data strings to an external device.

34. The device of claim 1, wherein said storage sites are identified in accordance with a table of contents and one of timing, cross marks, end marks, tracking lines, and an addressing system.

35. A device for storing and retrieving data from a non-volatile storage medium having storage sites, said non-volatile storage medium having at least one layer comprising one of the materials selected from the group of: metal, half metal, semiconductor, organic material, and compound material, and said storage sites being identified in accordance with a table of contents, said device comprising:
at least one charged particle ray source emitting a particle beam;
a charged particle deflection and scan unit that deflects and scans said particle beam of said at least one charged particle ray source over said storage medium;
a controller that determines parameters of said particle beam for reading and writing to and from said storage non-volatile storage medium; and
a detection unit that detects and amplifies a signal from said storage medium at said storage sites to determine information stored thereon.

36. The device of claim 35, wherein said signal is an adsorption current, wherein variations in said adsorption current is a result of different material characteristics of said storage sites, and wherein said different material characteristics are representative of information stored at said storage sites.

37. The device of claim 35, wherein said controller determines said parameters of said particle beam to selectively operate said particle beam in a read mode and a write mode to read and write said information to and from said storage sites, respectively, and wherein said controller determines a position of said particle beam to read and write to said storage sites.

38. The device of claim 37, wherein when said particle beam is in said writing mode, said controller alters said parameters of said particle beam and scans said storage sites to leave an imprint which corresponds to digital information to be stored.

39. The device of claim 37, wherein when said particle beam is in said reading mode, said controller alters said parameters of said particle beam and scans said particle beam over said predetermined storage sites of said storage medium.

40. The device of claim 38, wherein said read and write parameters of said particle beam are determined in accordance with a particle energy, a particle source, a particle ray density, and phase.

41. The device of claim 35, wherein said controller converts digital information input into said device into a sequence of instructions to said charged particle source such that said scanning charged particle beam creates a pattern of modified surface structure at said storage sites, maintains a table of contents containing information of locations of said storage sites, retrieves stored data at said storage sites, determines whether said stored data corresponds to a digital zero or a digital one, assembles said digital ones and zero to formatted data strings, and outputs said data strings to an external device.

* * * * *